(12) United States Patent
Luecke et al.

(10) Patent No.: US 7,433,422 B2
(45) Date of Patent: Oct. 7, 2008

(54) METHOD FOR GENERATING A SIGNAL WITH A DEFINABLE PULSE SHAPE

(75) Inventors: Sven Luecke, Unterschleissheim (DE); Andreas Salomon, Unterschleissheim (DE)

(73) Assignee: EADS Deutschland GmbH, Ottobrunn (DE)

( * ) Notice: Subject to any disclaimer, the term of this patent is extended or adjusted under 35 U.S.C. 154(b) by 597 days.

(21) Appl. No.: 11/108,689

(22) Filed: Apr. 19, 2005

(65) Prior Publication Data

US 2005/0243945 A1  Nov. 3, 2005

(30) Foreign Application Priority Data

Apr. 20, 2004 (DE) .................. 10 2004 018 986

(51) Int. Cl.
*H04L 25/03* (2006.01)

(52) U.S. Cl. ..................... 375/297; 455/114.3

(58) Field of Classification Search ......... 375/296–297, 375/377; 327/100, 133, 134; 455/114.2, 455/114.351; 330/51
See application file for complete search history.

(56) References Cited

U.S. PATENT DOCUMENTS

| | | | | |
|---|---|---|---|---|
| 4,928,072 | A | * | 5/1990 | Scott .......................... 330/149 |
| 5,675,611 | A | * | 10/1997 | Lehtinen et al. ............. 375/297 |
| 6,360,180 | B1 | | 3/2002 | Breger |
| 6,380,804 | B1 | * | 4/2002 | Ross .......................... 330/51 |
| 7,079,818 | B2 | * | 7/2006 | Khorram ................. 455/115.1 |
| 2003/0141894 | A1 | | 7/2003 | Gonzalez |

FOREIGN PATENT DOCUMENTS

| | | |
|---|---|---|
| DE | 29 04 011 | 2/1979 |
| DE | 30 23 861 A1 | 6/1980 |
| DE | 43 39 191 A1 | 11/1993 |
| DE | 198 56 800 C1 | 12/1998 |
| JP | 2002026999 | 1/2002 |

OTHER PUBLICATIONS

Partial English translation of previously submitted Japanese publication No. JP 2002026999.
Agilent Fundamentals of RF and Microwave Power measurements (Part 1), Introduction to Power, History, Definitions, International Standards and Traceability, Application No. 1449. Agilent Technologies, Inc., 2003, pp. 1-31.

* cited by examiner

*Primary Examiner*—Khanh C Tran
(74) *Attorney, Agent, or Firm*—Crowell & Moring LLP

(57) ABSTRACT

In a method of generating a pulse-shaped transmitted output signal having a definable pulse shape in a multistage amplifier arrangement, the course of the "pulse top" (upper edge) of the transmitted signal is determined by control signals at the amplifier stages. The control signals of the amplifier stages are definable such that the control signal of an amplifier stage in each case comprises a number of pulse sections of a predefinable frame pulse. The tops of the pulse sections each having a predefinable constant gradient. A predistortion is introduced into the control signals in this manner, having a course which offsets distortion of the pulse top which results when no predistortion is used.

10 Claims, 2 Drawing Sheets

METHOD FOR GENERATING A SIGNAL WITH A DEFINABLE PULSE SHAPE

BACKGROUND AND SUMMARY OF THE INVENTION

This application claims the priority of German patent document 10 2004 018 986.2, filed Apr. 20, 2004, the disclosure of which is expressly incorporated by reference herein.

The invention relates to a method for generating a pulse signal having a definable pulse shape, using a multistage amplifier.

A report by Agilent Technologies Inc. entitled "Fundamentals of RF and Microwave Power Measurement (Part 1)" and dated Apr. 17, 2003, addresses the possibility that, in the case of multistage high-frequency transmitter amplifiers, a signal pulse generated by the transmitter amplifier may not have the desired pulse shape. An undesirable shape is exhibited particularly by a distorted course along the "top" (or upper edge) of the pulse, as illustrated, for example, in FIG. 1. In this particular example, it can be seen that the pulse exhibits a considerable overshoot at its leading edge, which is followed by a falling course. As a result of such undesirable pulse shapes the transmitted pulses can be detected only poorly.

Methods and circuits by means of which pulse-shaped signals with a definable pulse top are generated are known from German Patent Documents DE 30 23 861 A1, DE 43 39 191 A1, DE 29 04 011 B2 and DE 198 56 800 C1. However, these disclosures do not provide for pulse shaping over a wide dynamic range.

It is therefore an object of the invention to provide a method which permits generation of a pulse with a definable pulse shape over a high range of dynamics.

This and other objects and advantages are achieved by the method according to the invention, in which the course of the pulse top (upper edge) of the transmitted signal is determined by control signals at the amplifier stages. According to the invention, the latter control signals are definable such that, in each case, the control signal of an amplifier stage comprises a number of pulse sections of a definable frame pulse, with the course (upper edge) of each pulse section having a definable constant gradient. (That is, it comprises a straight line, with a constant slope.)

The method according to the invention carries out a type of predistortion for the pulse top. These predistortions are applied to all control signals of the respective desired amplifier stages, which advantageously are emitter-modulated amplifier stages. As a result of the "predistortion" introduced by the control signal, a transmitted output signal is generated which has the desired pulse shape along its top.

The frame pulse for an individual amplifier stage, with for example, a pulse duration of 32 µs, is advantageously digitally shaped and subsequently converted to an analog signal. According to the invention, the frame pulse comprises a freely selectable number of pulse sections. The application of individually formed frame pulses to the control signals for the respective amplifier stages achieves an optimal pulse course (shape) of the transmitted output pulse.

The individual pulse sections of the frame pulse advantageously have a (constant) negative or positive value-gradient. In this manner, it becomes possible to generate a predistortion that causes the pulse signal to be amplified in such a way that the transmitted output pulse signal follows precisely the desired pulse shape, including along its top edge, and undesirable pulse signal courses are eliminated.

The individual pulse sections of the frame pulse may have identical or different lengths.

Other objects, advantages and novel features of the present invention will become apparent from the following detailed description of the invention when considered in conjunction with the accompanying drawings.

DETAILED DESCRIPTION OF THE DRAWINGS

Figure 1:
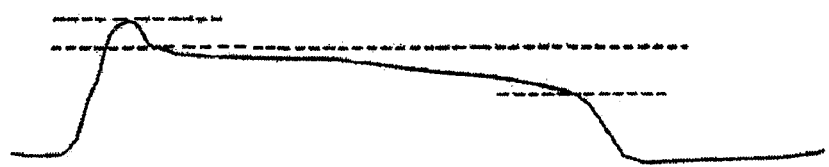
FIG. 1 illustrates the shape of a pulse waveform generated according to the prior art.
Figure 2:
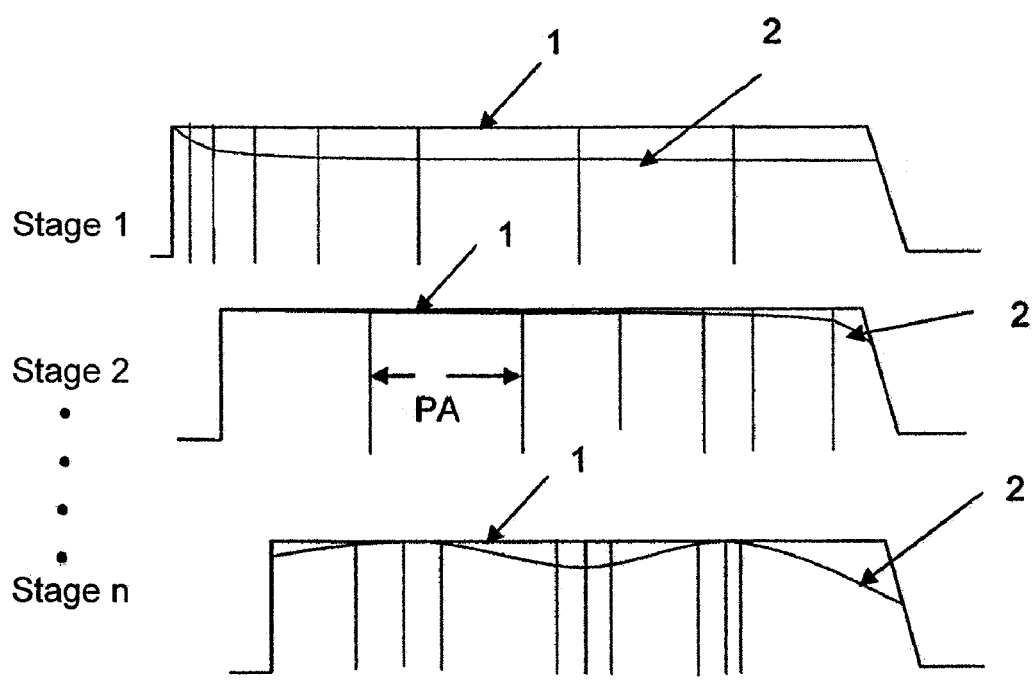
FIG. 2 is a view of several frame pulses, which have a number of pulse sections.

FIG. 2 illustrates several examples of frame pulses for amplifier stages 1 to n, each having a number of pulse sections PA. Reference number 1 indicates a frame pulse that does not include a predistortion, and reference number 2 indicates the frame pulse with a predistortion. Within the individual pulse sections PA, the frame pulse 2 in each cases has a value which exhibits a constant gradient. As described previously, the predistortions generated in this manner are applied to all control signals of the respective desired amplifier stages, which advantageously are emitter-modulated amplifier stages. As a result, a transmitted output signal is generated which has the desired pulse shape along its top.

Figure 3:
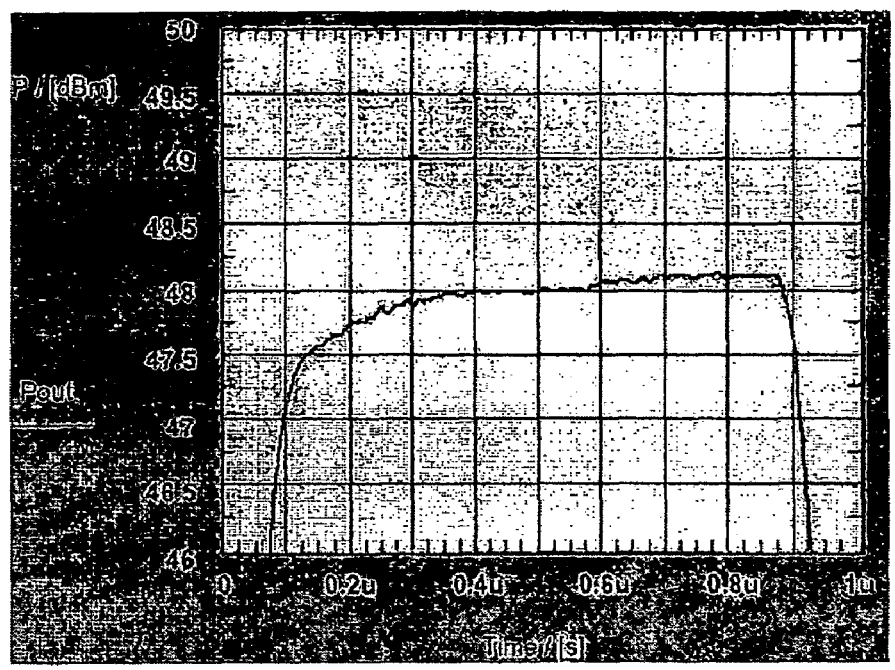
FIG. 3 shows the course of an RF pulse generated without predistortion of the pulse top.
Figure 4:
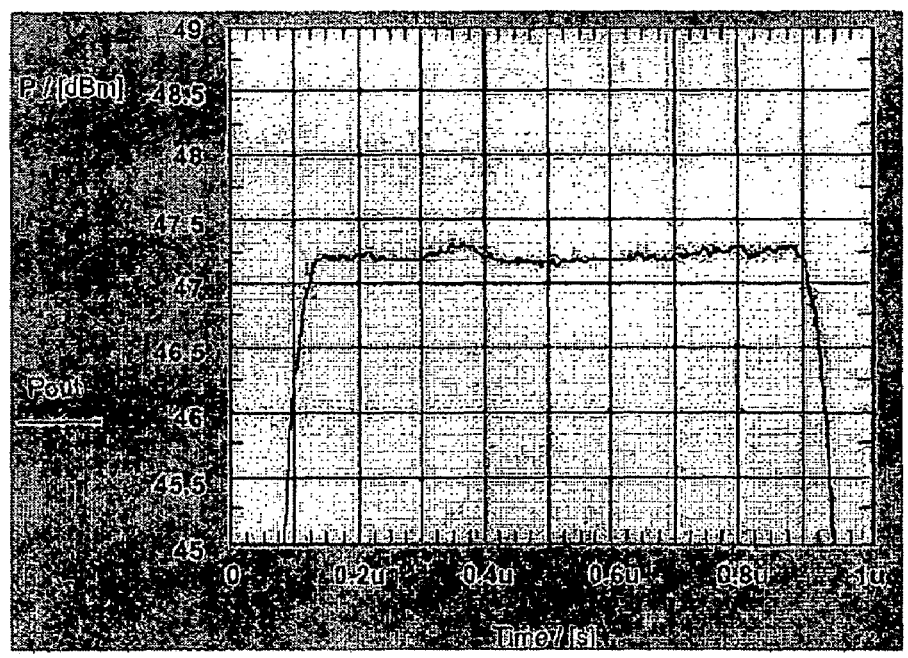
FIG. 4 shows the RF pulse of FIG. 3 with predistortion of the pulse top.

As an example, FIG. 3 shows an RF pulse generated without a predistortion of the pulse top as described above. The long rise time of the rising pulse edge is clearly indicated which undesirably influences the course of the pulse top. FIG. 4 shows the pulse from FIG. 3 with a predistortion of the pulse top according to the frame pulses of FIG. 2. That is, the pulse was amplified in the end stage of the multistage amplifier by means of a predistorted control signal whose course corresponds to that of the predistorted frame pulse, as illustrated by reference numeral 2 in FIG. 2. This amplification clearly influences the transmitted output pulse. After the implementation of the predistortion, the desired RF pulse power is then set again.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. Method for generating a pulse-shaped transmitted output signal having a definable pulse shape, via a multistage amplifier arrangement, in which the course of the pulse top of the transmitted signal is determined by control signals at the respective amplifier stages; said method comprising:
   forming the control signals of the respective amplifier stages by sequentially combining pulse sections of a predefinable frame pulse;
   wherein, the course of the tops of the pulse sections each have a predefinable constant gradient.

2. The method according to claim 1, wherein the amplifier stages are emitter-modulated.

3. The method according to claim 1, wherein the frame pulse is digitally shaped and is subsequently converted in an analog manner.

4. The method according to claim 3, wherein:
the pulse sections are conjoined to form a frame pulse;
the frame pulse is used to form the control signal; and
the gradient of the course of the tops of the individual pulse sections of the frame pulse is negative or positive.

5. The method according to claim 4, wherein the pulse sections have variable definable pulse lengths.

6. The method according to claim 5, wherein the control signal is formed based on a frame pulse that has a definable pulse length of up to 32 μs.

7. The method according to claim 6, wherein the number of frame pulses corresponds to the number of amplifier stages.

8. A method for generating a pulse, shaped output signal via a multistage amplifier arrangement in which a course of the output signal is determined by at least one control signal that is used to control the amplifier arrangement, said method comprising:

generating a predistorted control signal having a shape that is complementary to distortion of said pulse signal which results when a rectilinear control signal is used;

applying said predistorted control signal to at least one stage of the amplifier to generate said pulse shaped output signal;

wherein said step of generating a predistorted control signal comprises, forming a frame pulse comprising a sequential conjunction of a plurality of pulse sections, each of said pulse sections having a predefinable variable length and an upper edge that is characterized by a constant gradient said sequentially conjoined pulse sections collectively having an upper edge with a shape that corresponds to said complementary shape of said predistorted control signal; and using said framing pulse to form said control signal.

9. The method according to claim 8, wherein the control signal is formed based on a frame pulse that has a definable pulse length of up to 32 μs.

10. The method according to claim 8, wherein the number of frame pulses corresponds to the number of amplifier stages.

\* \* \* \* \*